(12) United States Patent
Lehmann et al.

(10) Patent No.: US 11,758,022 B2
(45) Date of Patent: Sep. 12, 2023

(54) COMPRESSION OF MACHINE-GENERATED DATA

(71) Applicant: ServiceNow, Inc., Santa Clara, CA (US)

(72) Inventors: Yaron Lehmann, Tel Aviv (IL); Dror Mann, New York, NY (US); Gabby Menahem, Santa Clara, CA (US)

(73) Assignee: ServiceNow, Inc., Santa Clara, CA (US)

( * ) Notice: Subject to any disclaimer, the term of this patent is extended or adjusted under 35 U.S.C. 154(b) by 82 days.

(21) Appl. No.: 17/031,558

(22) Filed: Sep. 24, 2020

(65) Prior Publication Data
US 2022/0094767 A1 Mar. 24, 2022

(51) Int. Cl.
*H04L 69/04* (2022.01)
*H03M 7/30* (2006.01)

(52) U.S. Cl.
CPC .......... *H04L 69/04* (2013.01); *H03M 7/3088* (2013.01)

(58) Field of Classification Search
CPC .............................. H04L 69/04; H03M 7/3088
USPC ........................................................ 709/247
See application file for complete search history.

(56) References Cited

U.S. PATENT DOCUMENTS

| 2007/0083571 A1* | 4/2007 | Meller | G06F 8/654 |
| | | | 707/999.203 |
| 2013/0346483 A1* | 12/2013 | Alstad | H04L 69/04 |
| | | | 709/203 |
| 2017/0039194 A1* | 2/2017 | Tschetter | G06F 16/93 |
| 2018/0336217 A1* | 11/2018 | Suzuki | G06F 16/1744 |
| 2019/0155925 A1* | 5/2019 | Giannikis | G06F 16/213 |

OTHER PUBLICATIONS

Bentley et al. Data Compression Using Long Common Strings. Data Compression Conference 1999: 287-295.

* cited by examiner

*Primary Examiner* — Mohamed A. Wasel
*Assistant Examiner* — John Fan
(74) *Attorney, Agent, or Firm* — Van Pelt, Yi & James LLP (57) ABSTRACT

A pre-shared compression dictionary is received. The pre-shared compression dictionary was generated based on an analysis of sample data for use in compression of other data. A compressed version of a batch of machine-generated data is received. The batch of machine-generated data has been compressed at least in part using the pre-shared compression dictionary and a batch-specific compression dictionary. The received compressed batch is uncompressed using the batch-specific compression dictionary to determine an intermediate version. The intermediate version is uncompressed using the pre-shared compression dictionary to determine an uncompressed version of the batch of machine-generated data.

20 Claims, 4 Drawing Sheets

COMPRESSION OF MACHINE-GENERATED DATA

BACKGROUND OF THE INVENTION

In order to reduce the amount of network bandwidth required to transmit data, the data can be compressed to reduce its size. However, compressing a large amount of data consumes valuable computing resources that could have been used for other tasks. A compression algorithm efficiency can be measured by its ability to yield higher compression rate at fewer CPU cycles. Therefore it would be beneficial to have a more efficient way to compress data.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Sending machine-generated data, (e.g., log data), from a generator (e.g., application server) to a receiving entity (e.g. log management server), consumes compute and network (e.g., bandwidth) resources. Sent data is often compressed before shipping, where the compression level presents a trade-off between compute resources (e.g., required to deflate and inflate the data) and network resources. The compression may involve, at high level, scanning the to-be-shipped data and calculating a compression dictionary, and compressing the data using the calculated dictionary. Calculating the dictionary for large data is often compute intensive. Machine-generated data, and logs in particular, are very repetitive—a very small number of log patterns often account for most of the logged events; and every log line itself is mostly constant text with few variables. This can be taken into account to provide a more efficient compression. For example, rather than independently compressing each different batch of log entries to be sent, a compression of each batch of log entries (a) re-uses a pre-shared compression dictionary across subsequently sent batches, (b) builds this pre-shared compression dictionary using more data than what's sent in a single batch, and (c) utilizes a higher compression level/compute effort in building this pre-shared compression dictionary (e.g., since this dictionary is reused and updated less frequently, trade-off of higher compute resource utilization is worth gains in compression optimization of the dictionary). In some embodiments, to achieve additional compression, the pre-shared compression dictionary is used first to compress the batch of data and a subsequent additional compression is performed using a standard compression of using a dictionary determined for the specific batch.

In various embodiments, on a receiver end, a pre-shared compression dictionary is received. The pre-shared compression dictionary was generated by a sender based on an analysis of a sample data for use in compression of other data (e.g., future data). A compressed version of a batch of machine-generated log data compressed at least in part using the pre-shared compression dictionary and a batch-specific compression dictionary is received. For example, the group of machine-generated log data analyzed to generate the pre-shared compression dictionary includes data not included in the batch of machine-generated log data. The received compressed batch is uncompressed using the batch-specific compression dictionary to determine an intermediate version. The intermediate version is uncompressed to determine an uncompressed version of the batch of machine-generated log data.

Figure 1:
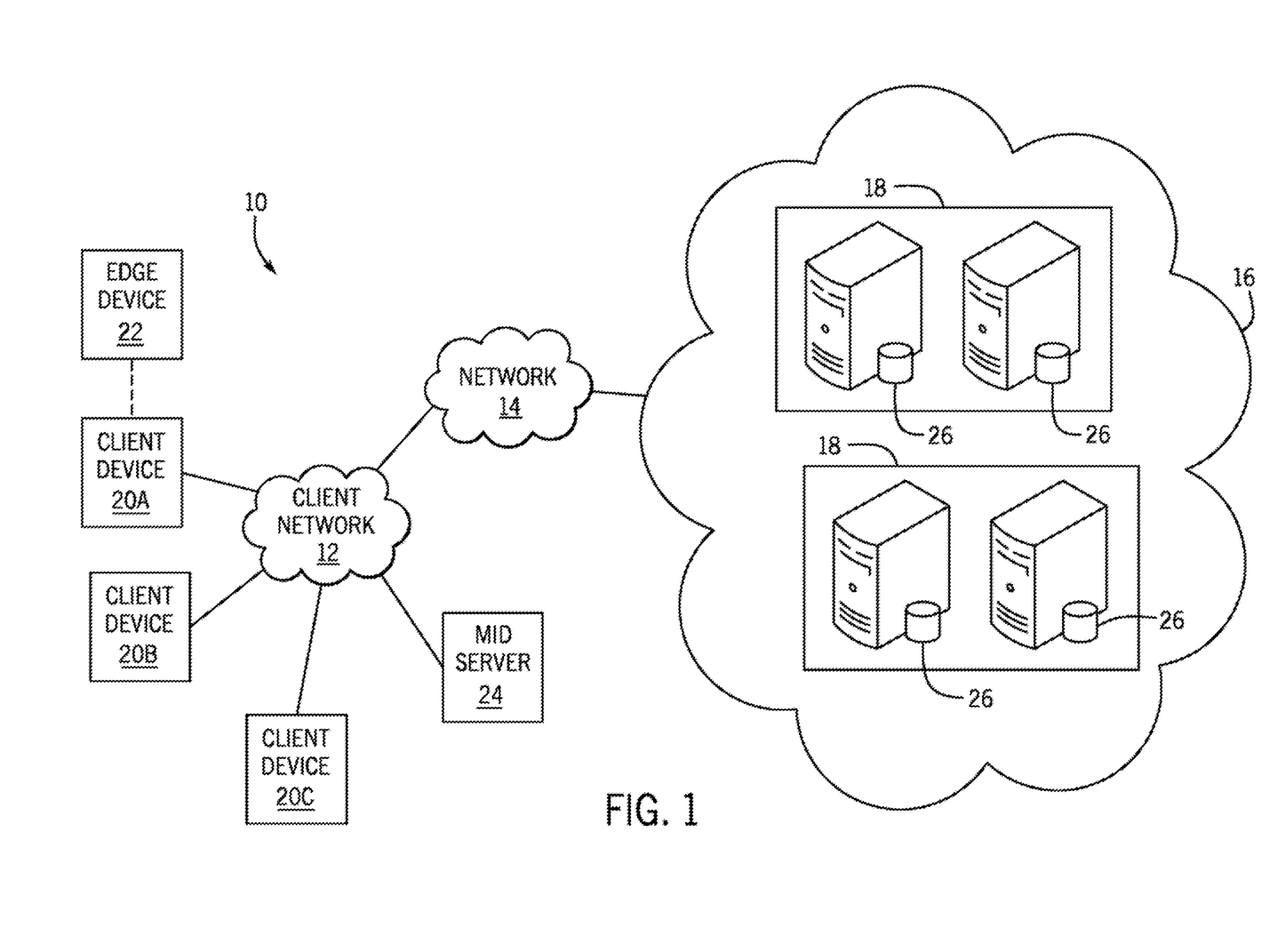
FIG. 1 is a schematic diagram of an embodiment of a computing environment.

With the preceding in mind, the following figures relate to various types of generalized system architectures or configurations that may be employed to provide services to an organization on which the present approaches may be employed. Correspondingly, these system and platform examples may also relate to systems and platforms on which the techniques discussed herein may be implemented or otherwise utilized. Turning now to FIG. 1, a schematic diagram of an embodiment of a computing system 10, such as a cloud computing system, in which embodiments of the present disclosure may operate, is illustrated. The computing system 10 may include a client network 12, a network 14 (e.g., the Internet), and a cloud-based platform 16. In some implementations, the cloud-based platform 16 may be a configuration management database (CMDB) platform. In one embodiment, the client network 12 may be a local private network, such as a local area network (LAN) that includes a variety of network devices that include, but are not limited to, switches, servers, and routers. In another embodiment, the client network 12 represents an enterprise network that could include one or more LANs, virtual networks, data centers 18, and/or other remote networks. As shown in FIG. 1, the client network 12 is able to connect to one or more client devices 20A, 20B, and 20C so that the client devices are able to communicate with each other and/or with the network hosting the platform 16. The client devices 20A-C may be computing systems and/or other types of computing devices generally referred to as Internet of Things (IoT) devices that access cloud computing services, for example, via a web browser application or via an edge device 22 that may act as a gateway between the client devices 20A-C and the platform 16. FIG. 1 also illustrates that the client network 12 includes a management, instrumentation, and discovery (MID) server 24 that facilitates communication of data between the network hosting the platform 16, other external applications, data sources, and services, and the client network 12. Although not specifically illustrated in FIG. 1, the client network 12 may also include a connecting network device (e.g., a gateway or router) or a combination of devices that implement a customer firewall or intrusion protection system.

For the illustrated embodiment, FIG. 1 illustrates that client network 12 is coupled to the network 14, which may include one or more computing networks, such as other LANs, wide area networks (WAN), the Internet, and/or other remote networks, in order to transfer data between the client devices 20A-C and the network hosting the platform 16. Each of the computing networks within network 14 may contain wired and/or wireless programmable devices that operate in the electrical and/or optical domain. For example, network 14 may include wireless networks, such as cellular networks (e.g., Global System for Mobile Communications (GSM) based cellular network), WIFI networks, and/or other suitable radio-based networks. The network 14 may also employ any number of network communication protocols, such as Transmission Control Protocol (TCP) and Internet Protocol (IP). Although not explicitly shown in FIG. 1, network 14 may include a variety of network devices, such as servers, routers, network switches, and/or other network hardware devices configured to transport data over the network 14.

In FIG. 1, the network hosting the platform 16 may be a remote network (e.g., a cloud network) that is able to communicate with the client devices 20A-C via the client network 12 and network 14. The network hosting the platform 16 provides additional computing resources to the client devices 20A-C and/or the client network 12. For example, by utilizing the network hosting the platform 16, users of the client devices 20A-C are able to build and execute applications for various enterprise, IT, and/or other organization-related functions. In one embodiment, the network hosting the platform 16 is implemented on the one or more data centers 18, where each data center could correspond to a different geographic location. Each of the data centers 18 includes a plurality of servers 26 (also referred to herein as application nodes, virtual servers, application servers, virtual server instances, application instances, or application server instances), where each server 26 can be implemented on a physical computing system, such as a single electronic computing device (e.g., a single physical hardware server) or across multiple-computing devices (e.g., multiple physical hardware servers). Examples of servers 26 include, but are not limited to, a virtual server, a web server (e.g., a unitary Apache installation), an application server (e.g., a unitary Java Virtual Machine), and/or a database server.

To utilize computing resources within the platform 16, network operators may choose to configure the data centers 18 using a variety of computing infrastructures. In one embodiment, one or more of the data centers 18 are configured using a multi-instance cloud architecture to provide every customer with its own unique customer instance or instances. For example, a multi-instance cloud architecture could provide each customer instance with its own dedicated application server and dedicated database server. In other examples, the multi-instance cloud architecture could deploy a single physical or virtual server 26 and/or other combinations of physical and/or virtual servers 26, such as one or more dedicated web servers, one or more dedicated application servers, and one or more database servers, for each customer instance. In a multi-instance cloud architecture, multiple customer instances could be installed on one or more respective hardware servers, where each customer instance is allocated certain portions of the physical server resources, such as computing memory, storage, and processing power. By doing so, each customer instance has its own unique software stack that provides the benefit of data isolation, relatively less downtime for customers to access the platform 16, and customer-driven upgrade schedules.

In some embodiments, the cloud-based platform 16 includes a machine-generated data management server that receives via network 14 and/or an internal network within or across different data centers, machine-generated data for storage and analysis. For example, log entries are sent from client devices/servers 20, MID server 24 (e.g., agent server acting as the intermediary in client network 12 to facilitate access to client network 12 by the network hosting the platform 16) and/or servers in data centers 18 to a log management server in data centers 18.

Although FIG. 1 illustrates specific embodiments of a cloud computing system 10, the disclosure is not limited to the specific embodiments illustrated in FIG. 1. For instance, although FIG. 1 illustrates that the platform 16 is implemented using data centers, other embodiments of the platform 16 are not limited to data centers and can utilize other types of remote network infrastructures. Moreover, other embodiments of the present disclosure may combine one or more different virtual servers into a single virtual server. The use and discussion of FIG. 1 are only examples to facilitate ease of description and explanation and are not intended to limit the disclosure to the specific examples illustrated therein. As may be appreciated, the respective architectures and frameworks discussed with respect to FIG. 1 incorporate computing systems of various types (e.g., servers, workstations, client devices, laptops, tablet computers, cellular telephones, and so forth) throughout. For the sake of completeness, a brief, high level overview of components typically found in such systems is provided. As may be appreciated, the present overview is intended to merely provide a high-level, generalized view of components typical in such computing systems and should not be viewed as limiting in terms of components discussed or omitted from discussion.

Figure 2:
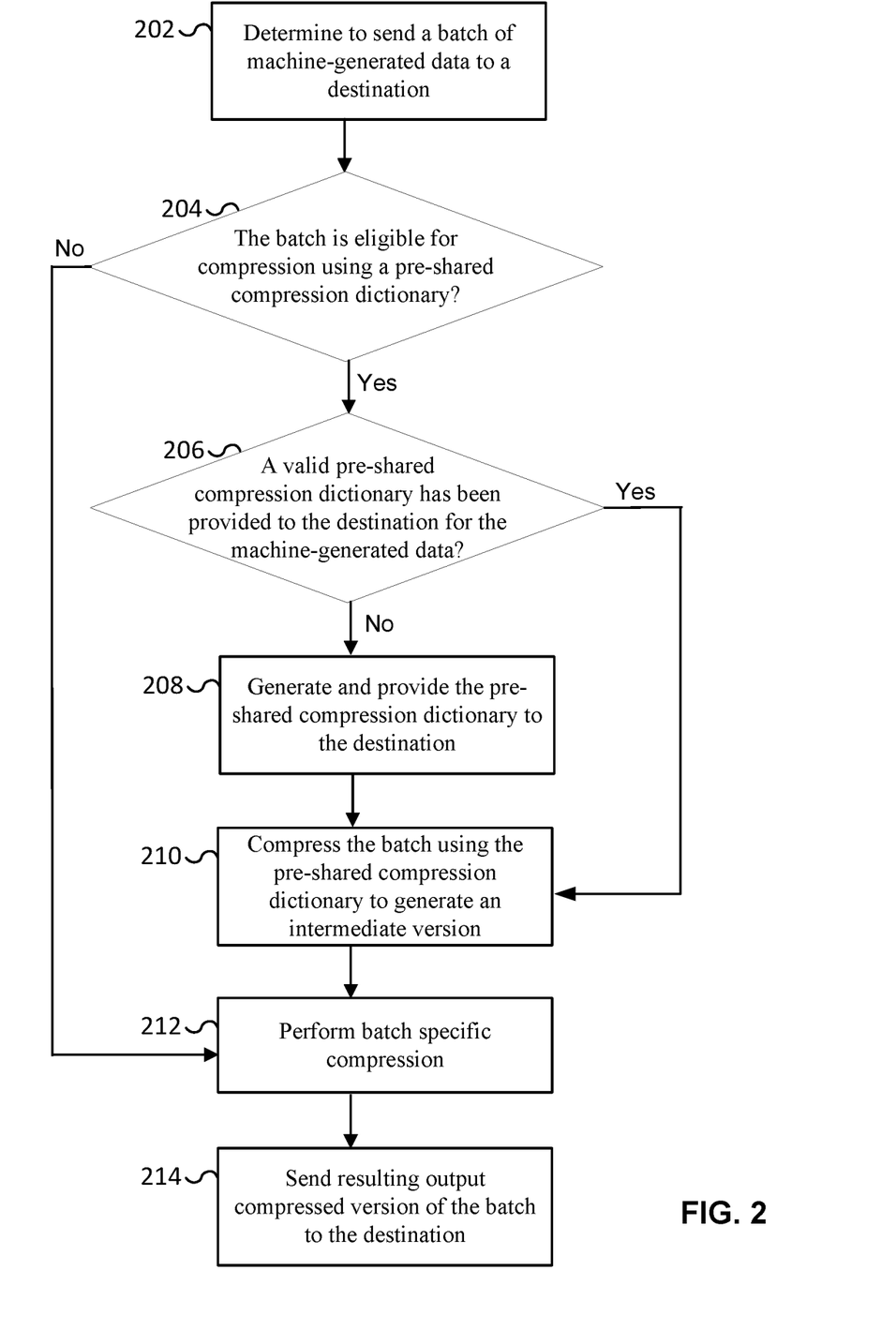
FIG. 2 is a flowchart illustrating an embodiment of a process for compressing machine-generated data.

FIG. 2 is a flowchart illustrating an embodiment of a process for compressing machine-generated data. The process of FIG. 2 may be implemented on a source of machine-generated data (e.g., a server of data center 18, MID server 24, and/or any of client devices 20A-C of FIG. 1.

At 202, it is determined to send a batch of machine-generated data to a destination. An example of the machine-generated data includes log data including recording of computer events. For example, alerts, status, outputs, transactions, messages, or other events of an application or other computer software or hardware component are outputted (e.g., continual stream) to a log as entries/lines in the log (e.g., file, database, memory, etc.). The machine-generated data may be generated by a customer device and sent for storage and/or analysis by a third-party service provider device (i.e., third-party different from sending party) and/or generated by a local device and sent to another networked device for storage and/or analysis. Log entries may be periodically and/or dynamically generated and locally cached (e.g., in a local file and/or database) for a period of time. New log entries that have not been sent can then be transferred to a destination in batches (e.g., each may contain new log entries not included in previously sent batches and/or may be capped in size up to a size limit). Each batch can be sent periodically (e.g., a new batch sent at periodic intervals) and/or dynamically (e.g., when the size of log entries not yet sent reaches a threshold size). In some embodiments, the destination receives the machine-generated data and stores/archives the machine-generated data and/or performs processing and/or analysis. For example, the destination serves as a log repository and/or a log analysis service provider. However, because there may be a large amount of data to be sent to the destination, the machine-generated data is to be compressed to conserve bandwidth and other network resources. However, data compression is compute-intensive and the compression is performed in an efficient manner by leveraging knowledge that similar data is being sent across different batches of the same machine-generated data/log.

At 204, it is determined whether the batch is eligible for compression using a pre-shared compression dictionary. For example, only certain one(s) of machine-generated data files/sources are to be compressed using a pre-shared compression dictionary and it is determined whether the batch is a part of the one(s) of machine-generated data files/sources to be compressed using a pre-shared compression dictionary. Thus, in some embodiments, if the batch is a part of the one(s) of machine-generated data files/sources to be compressed using a pre-shared compression dictionary, the batch is eligible, and otherwise, it is not eligible. These one(s) of machine-generated data files/sources may have been selected for pre-shared dictionary compression due to them being of a certain nature/type (e.g., likely to contain repeated portions) that would benefit from pre-shared dictionary compression. Identifying whether the batch is a part of the one(s) of machine-generated data files/sources to be compressed using a pre-shared compression dictionary may include comparing a filename, an application identifier, a server identifier type, a type/category identifier, and/or other property identifier associated with the machine-generated data file/source of the batch with specified criteria.

In some embodiments, determining whether the batch is eligible for compression using the pre-shared compression dictionary includes determining whether a valid pre-shared compression dictionary can be determined for the machine-generated data file/source of the batch. For example, if the machine-generated data file/source is relatively new without other historical content/entries beyond the batch, it is determined that a valid pre-shared compression dictionary cannot be effectively generated. Thus it is determined that the batch is not eligible for compression using a pre-shared compression dictionary if not enough data is available to generate an effective valid pre-shared compression dictionary, and it is determined that the batch is eligible for compression using a pre-shared compression dictionary if an effective valid pre-shared compression dictionary can be generated.

If at 204, it is determined that the batch is not eligible for compression using a pre-shared compression dictionary, the process proceeds to 212. In some embodiments, the pre-shared compression dictionary is for a single log input stream while in other embodiments the pre-shared compression dictionary is for multiple log input streams. For example, if the sender of the batch is provided log entries from multiple streams, the batch may include entries from a prior existing input stream as well as a new input stream that may degrade the compression performance of the batch. In some embodiments, the compression performance of the pre-shared dictionary is continuously evaluated, and if the compression performance is detected to be below a threshold (e.g., a new log input stream is introduced), rebuilding of the pre-shared compression dictionary is triggered. If at 204, it is determined that the batch is eligible for compression using a pre-shared compression dictionary, at 206, it is determined whether a valid pre-shared compression dictionary has been provided to the destination for the machine-generated data. A compression dictionary can be used to compress and decompress data, for example, an entry in the compression dictionary identifies a common string portion of a reference to this entry that can replace the common string portion in the data to compress/reduce its size. Using the same compression dictionary, the process can be reversed to decompress the compressed data. The same pre-shared compression dictionary can be used across different sent batches for the same machine-generated data file or data source (e.g., same log file/source). Thus this pre-shared compression dictionary only needs to be shared with the destination one time and the destination can reuse this same dictionary to decompress other compressed batches. Thus if the pre-shared compression dictionary to be used to compress the batch of data to be sent has been already sent to the destination for use during decompression, it is determined that a valid pre-shared compression dictionary has been sent to the destination for the machine-generated data.

In some embodiments, a same pre-shared compression dictionary is shared across a plurality of different machine-generated data files/sources. For example, in order to increase reusability of the dictionary further, the pre-shared compression dictionary has been generated and sent for use across multiple different batches of various different machine-generated data files/sources (e.g., an indicated group of different machine-generated data/log files/sources of a common particular sender/client/server/application/system). In some embodiments, because data in the same machine-generated data/log file/source can change over time, the pre-shared compression dictionary is expired periodically and/or dynamically (e.g., upon detection of a threshold amount of change in data or reduction in compressibility of data), and the pre-shared compression dictionary is to be regenerated based on recent data and the updated dictionary is to be sent to the destination. For example, it is determined that a valid pre-shared compression dictionary has not been sent to the destination for the machine-generated data if a previously provided pre-shared compression dictionary is no longer valid and is to be updated.

If at 206 it is determined that the valid pre-shared compression dictionary has been provided to the destination, the process proceeds to 210. If at 206 it is determined that the valid pre-shared compression dictionary has not been provided to the destination, at 208, the pre-shared compression dictionary is generated and provided to the destination. In some embodiments, generating the pre-shared compression dictionary includes analyzing sample data to identify portions that are most frequently repeated in the sample data. The sample data may include data of the batch as well as other historical data of the machine-generated data file/source of the batch and/or other machine-generated data files/sources. For example, when reading from a file, a certain historical amount of the latest entries included in the machine-generated data file/source beyond the entries to-be-sent is included in the sample data for analysis. If the pre-shared compression dictionary is to be used to compress data batches for a plurality of different computer-generated data files/sources, the sample data for analysis may include entries (e.g., historical entries from latest time period) from the plurality of different computer-generated data files/sources. Given the nature of machine-generated data, the sample data is likely to include portions (e.g., strings of characters) that are often repeated. These portions are identified and ranked based on character length and number of times they are repeated. For example, suffix trees and/or suffix arrays are determined for the content of the sample data and longest common strings are identified and ranked. Based on a combination of one or more rankings, the portions to be included in the pre-shared compression dictionary are selected. For example, the portions are included in the dictionary starting from the top expected compression rank order (e.g., rank order based on character length of the portion and number of times the portion is repeated in the content of the sample data) until the size of the dictionary reaches a threshold (e.g., maximum size of the dictionary). In another example, the portions that are repeated at least a threshold number of times in the content of the sample data are included in the dictionary starting from longest in character length to shortest until the size of the dictionary reaches a threshold (e.g., maximum size of the dictionary). Once generated, the pre-shared compression dictionary can be used to compress future batches of at least the same machine-generated data file/source until expired.

At 210, the batch is compressed using the pre-shared compression dictionary to generate an intermediate version. The pre-shared compression dictionary to be used has been selected based on the machine-generated data file/source of the batch. Compressing the batch may include analyzing content of the batch to replace instances of portions of the batch matching content portion items in the pre-shared compression dictionary with references/identifiers to the corresponding pre-shared compression dictionary items. Thus the intermediate version is a lossless version of the batch that includes references/identifiers to the corresponding pre-shared compression dictionary items. Because the pre-shared compression dictionary can be reused at least across different batches, compression benefits can be obtained with reduced processing load. However, just using compression based on the pre-shared compression dictionary may not compress the batch as much as the compression that can be achieved by performing a compression using a compression dictionary generated specifically for the batch.

At 212, a batch specific compression is performed. In some cases, to increase the amount of compression, the intermediate version is compressed using batch specific compression. By compressing the intermediate version instead of the original uncompressed batch using batch specific compression, the amount of processing required to perform the batch specific compression is reduced because the intermediate version is smaller in size than the original uncompressed batch. In some embodiments, performing the batch specific compression includes analyzing the intermediate version to generate a batch-specific compression dictionary for the intermediate version. For example, strings of characters that are repeated in the intermediate version are identified and included in the batch-specific compression dictionary based on character length and/or number of times they are repeated (e.g., most frequently repeated long strings are included in the dictionary). Then content portions of the intermediate version matching items in the batch-specific compression dictionary are replaced with corresponding references/identifiers to the corresponding batch-specific compression dictionary items to generate a resulting output compressed version. The resulting output compressed version includes the batch-specific compression dictionary.

In some cases, because pre-shared compression dictionary compression was not available, content of the original batch is compressed using batch specific compression (e.g., longest-common subsequence compression). For example, strings of characters that are repeated in the original batch are identified and included in the batch-specific compression dictionary based on character length and/or number of times they are repeated (e.g., most frequently repeated long strings are included in the dictionary). Then content portions of the batch matching items in the batch-specific compression dictionary are replaced with corresponding references/identifiers to the corresponding batch-specific compression dictionary items to generate a resulting output compressed version. The resulting output compressed version includes the batch-specific compression dictionary.

At 214, the resulting output compressed version of the batch is sent to the destination. For example, the compressed version is sent via a network.

Figure 3:
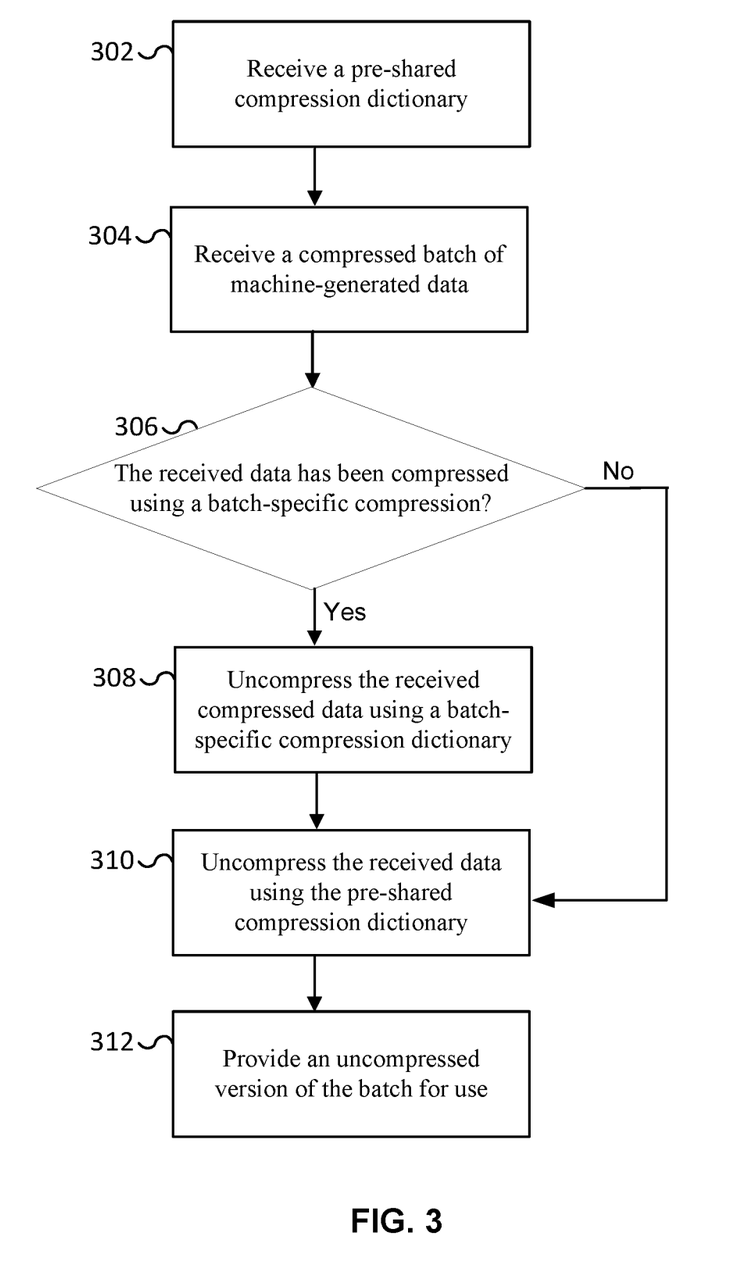
FIG. 3 is a flowchart illustrating an embodiment of a process for decompressing compressed machine-generated data.

FIG. 3 is a flowchart illustrating an embodiment of a process for decompressing compressed machine-generated data. For example, the process of FIG. 3 is used at the destination to decompress the compressed version sent in 214 of FIG. 2. The process of FIG. 3 may be implemented on a server of data center 18 of FIG. 1.

At 302, a pre-shared compression dictionary is received. In some embodiments, the pre-shared compression dictionary is the pre-shared compression dictionary provided at 208 of FIG. 2. The pre-shared compression dictionary allows data compressed using the pre-shared compression dictionary to be uncompressed using the pre-shared compression dictionary.

At 304, a compressed batch of machine-generated data is received. For example, the compressed data sent in 214 of FIG. 2 is received.

At 306, it is determined whether the received compressed data has been compressed using a batch-specific compression. For example, the received data is analyzed to determine whether it has been compressed using a compression technique performed based only on the contents of the batch itself (e.g., compressed in 212 of FIG. 2).

If at 306 it is determined that the received compressed data has not been compressed using a batch-specific compression, the process proceeds to 310. If at 306 it is determined that the received compressed data has been compressed using a batch-specific compression, at 308, the received compressed data is uncompressed using a batch-specific compression dictionary. For example, the received data includes the batch-specific compression dictionary and references in the compressed data to the dictionary are replaced with respective content portions in the dictionary.

At 310, the received data is uncompressed using the pre-shared compression dictionary. The data to be uncompressed is either a result of the uncompressed result in 308 (e.g., intermediate version) or the original received compressed batch based on the determination in 306. In some embodiments, the data to be uncompressed is effectively the intermediate version of 210 of FIG. 2. The pre-shared compression dictionary to be received to uncompress the received data is identified. For example, based on an identifier of a file or source of the batch and/or a sender of the batch, the corresponding pre-shared compression dictionary is identified. Uncompressing the received data may include replacing references in the received data to the pre-shared compression dictionary with respective content portions from the pre-shared compression dictionary.

At 312, an uncompressed version of the batch (e.g., result of 310) is provided for use. For example, the resulting uncompressed machine-generated data is provided for archival and/or analysis.

Figure 4:
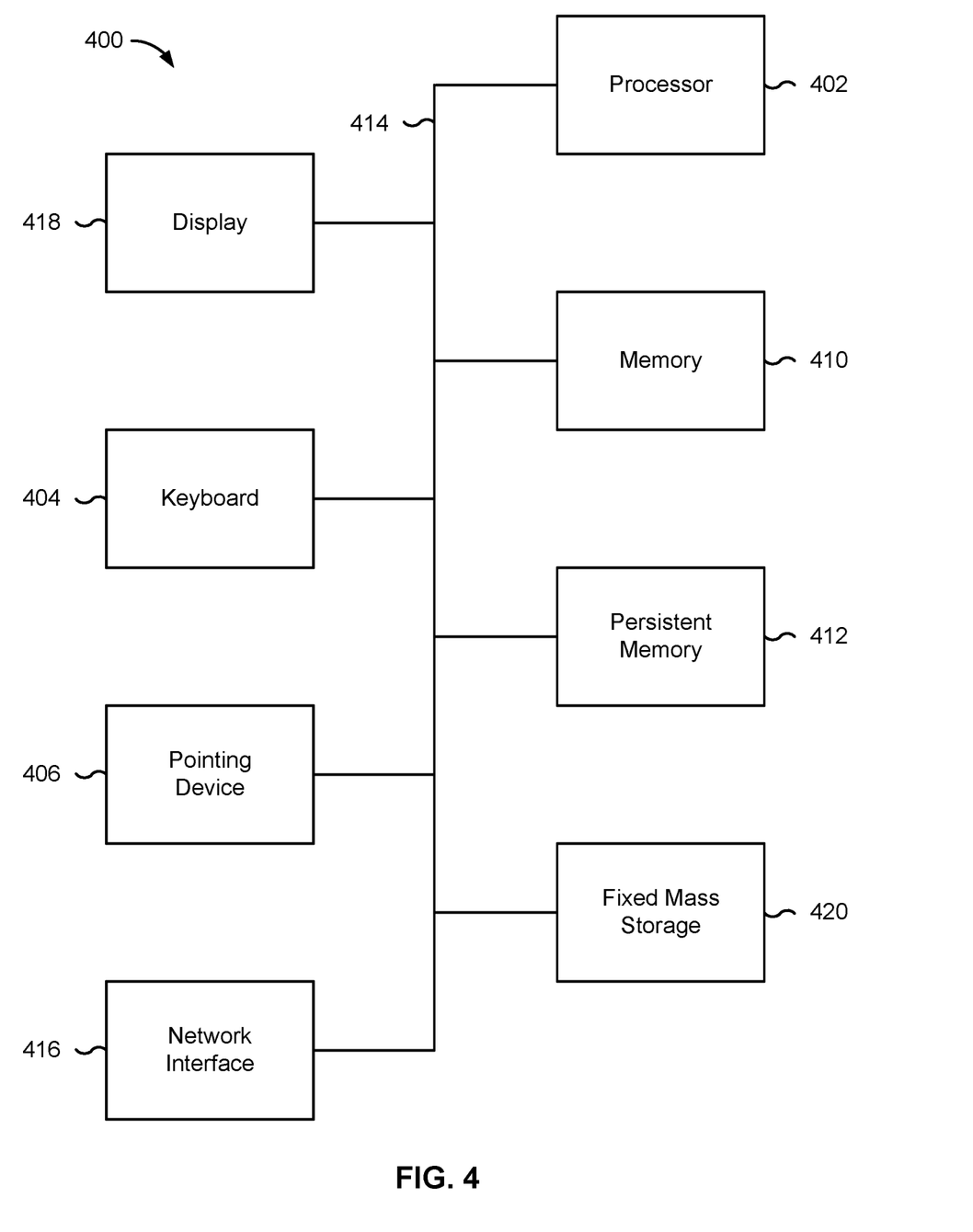
FIG. 4 is a functional diagram illustrating a programmed computer system.

FIG. 4 is a functional diagram illustrating a programmed computer system. In some embodiments, the programmed computer system is any device or server shown in FIG. 1.

In the example shown, computer system 400 includes various subsystems as described below. Computer system 400 includes at least one microprocessor subsystem (also referred to as a processor or a central processing unit (CPU)) 402. For example, processor 402 can be implemented by a single-chip processor or by multiple processors. In some embodiments, processor 402 is a general-purpose digital processor that controls the operation of computer system 400. Using instructions retrieved from memory 410, processor 402 controls the reception and manipulation of input data, and the output and display of data on output devices (e.g., display 418).

Processor 402 is coupled bi-directionally with memory 410, which can include a first primary storage, typically a random-access memory (RAM), and a second primary storage area, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 402. Also, as is well known in the art, primary storage typically includes basic operating instructions, program code, data, and objects used by processor 402 to perform its functions (e.g., programmed instructions). For example, memory 410 can include any suitable computer-readable storage media, described below, depending on whether, for example, data access needs to be bi-directional or uni-directional. For example, processor 402 can also directly and very rapidly retrieve and store frequently needed data in a cache memory (not shown).

Persistent memory 412 (e.g., a removable mass storage device) provides additional data storage capacity for computer system 400, and is coupled either bi-directionally (read/write) or uni-directionally (read only) to processor 402. For example, persistent memory 412 can also include computer-readable media such as magnetic tape, flash memory, PC-CARDS, portable mass storage devices, holographic storage devices, and other storage devices. A fixed mass storage 420 can also, for example, provide additional data storage capacity. The most common example of fixed mass storage 420 is a hard disk drive. Persistent memory 412 and fixed mass storage 420 generally store additional programming instructions, data, and the like that typically are not in active use by processor 402. It will be appreciated that the information retained within persistent memory 412 and fixed mass storages 420 can be incorporated, if needed, in standard fashion as part of memory 410 (e.g., RAM) as virtual memory.

In addition to providing processor 402 access to storage subsystems, bus 414 can also be used to provide access to other subsystems and devices. As shown, these can include a display monitor 418, a network interface 416, a keyboard 404, and a pointing device 406, as well as an auxiliary input/output device interface, a sound card, speakers, and other subsystems as needed. For example, pointing device 406 can be a mouse, stylus, track ball, or tablet, and is useful for interacting with a graphical user interface.

Network interface 416 allows processor 402 to be coupled to another computer, computer network, or telecommunications network using a network connection as shown. For example, through network interface 416, processor 402 can receive information (e.g., data objects or program instructions) from another network or output information to another network in the course of performing method/process steps. Information, often represented as a sequence of instructions to be executed on a processor, can be received from and outputted to another network. An interface card or similar device and appropriate software implemented by (e.g., executed/performed on) processor 402 can be used to connect computer system 400 to an external network and transfer data according to standard protocols. Processes can be executed on processor 402, or can be performed across a network such as the Internet, intranet networks, or local area networks, in conjunction with a remote processor that shares a portion of the processing. Additional mass storage devices (not shown) can also be connected to processor 402 through network interface 416.

An auxiliary I/O device interface (not shown) can be used in conjunction with computer system 400. The auxiliary I/O device interface can include general and customized interfaces that allow processor 402 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: magnetic media such as hard disks, floppy disks, and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code, as produced, for example, by a compiler, or files containing higher level code (e.g., script) that can be executed using an interpreter.

The computer system shown in FIG. 4 is but an example of a computer system suitable for use with the various embodiments disclosed herein. Other computer systems suitable for such use can include additional or fewer subsystems. In addition, bus 414 is illustrative of any interconnection scheme serving to link the subsystems. Other computer architectures having different configurations of subsystems can also be utilized.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
receiving a pre-shared compression dictionary, wherein the pre-shared compression dictionary was generated based on an analysis of sample data for use in compression of other data;
receiving a compressed version of a batch of machine-generated data, wherein the batch of machine-generated data has been compressed together at least in part using the pre-shared compression dictionary and a batch-specific compression dictionary, wherein the pre-shared compression dictionary is shared across a plurality different batches and the batch-specific compression dictionary is generated based on content of an intermediate version of a single batch among the plurality different batches that share the pre-shared compression dictionary, and the compressed version of the batch of machine-generated data has been compressed together using at least two different compression dictionaries including the pre-shared compression dictionary and the batch-specific compression dictionary;
uncompressing the received compressed version of the batch using the batch-specific compression dictionary different from the pre-shared compression dictionary to determine the intermediate version; and
uncompressing the intermediate version using the pre-shared compression dictionary to determine an uncompressed version of the batch of machine-generated data.

2. The method of claim 1, wherein the machine-generated data includes computer log entries.

3. The method of claim 1, wherein the sample data analyzed to generate the pre-shared compression dictionary includes contents of previously sent batches of a same source of the machine-generated data.

4. The method of claim 1, wherein the sample data analyzed to generate the pre-shared compression dictionary includes contents of the batch.

5. The method of claim 1, wherein the sample data analyzed to generate the pre-shared compression dictionary includes contents of a plurality different log files.

6. The method of claim 1, wherein the pre-shared compression dictionary is received separately from the compressed version of the batch.

7. The method of claim 1, wherein the analysis of the sample data includes performing identifications of portions of the sample data that are repeated in the sample data.

8. The method of claim 7, wherein the analysis of the sample data includes ranking the identified repeated portions on character length and a number of repeats in the sample data.

9. The method of claim 1, wherein the analysis of the sample data included a determination of suffix trees and/or suffix arrays for the sample data.

10. The method of claim 1, further comprising storing the uncompressed version of the batch of machine-generated data in an archival storage.

11. The method of claim 1, further comprising analyzing the uncompressed version of the batch of machine-generated data.

12. A system, comprising:
one or more processors configured to:
receive a pre-shared compression dictionary, wherein the pre-shared compression dictionary was generated based on an analysis of sample data for use in compression of other data;
receive a compressed version of a batch of machine-generated data, wherein the batch of machine-generated data has been compressed together at least in part using the pre-shared compression dictionary and a batch-specific compression dictionary, wherein the pre-shared compression dictionary is shared across a plurality different batches and the batch-specific compression dictionary is generated based on content of an intermediate version of a single batch among the plurality different batches that share the pre-shared compression dictionary, and the compressed version of the batch of machine-generated data has been compressed together using at least two different compression dictionaries including the pre-shared compression dictionary and the batch-specific compression dictionary
uncompress the received compressed version of the batch using the batch-specific compression dictionary different from the pre-shared compression dictionary to determine the intermediate version; and
uncompress the intermediate version using the pre-shared compression dictionary to determine an uncompressed version of the batch of machine-generated data; and
a memory coupled to the one or more processors and configured to provide the one or more processors with instructions.

13. A method, comprising:
determining to send a batch of machine-generated data;
determining whether a valid pre-shared compression dictionary has been provided to a destination for the machine-generated data;
determining that the valid pre-shared compression dictionary has been previously provided to the destination for the machine-generated data;
compressing together the batch of machine-generated data using the valid pre-shared compression dictionary to generate an intermediate version, wherein the valid pre-shared compression dictionary was generated based on an analysis of sample data that did not include contents of the batch of machine-generated data;
compressing the intermediate version using a batch-specific compression dictionary different from the pre-shared compression dictionary to generate an output compressed version, wherein the pre-shared compression dictionary is shared across a plurality different batches and the batch-specific compression dictionary generated based on content of the intermediate version of a single batch among the plurality different batches that share the pre-shared compression dictionary, and the output compressed version has been compressed using at least two different compression dictionaries including the pre-shared compression dictionary and the batch-specific compression dictionary; and
sending to the destination the output compressed version.

14. The method of claim 13, wherein the machine-generated data includes computer log entries.

15. The method of claim 13, wherein the sample data analyzed to generate the valid pre-shared compression dictionary includes contents of previously sent batches of a same source of the machine-generated data.

16. The method of claim 13, wherein the sample data analyzed to generate the valid pre-shared compression dictionary includes contents of a plurality different log files.

17. The method of claim 13, wherein the analysis of the sample data includes performing identifications of portions of the sample data that are repeated in the sample data.

18. The method of claim 17, wherein the analysis of the sample data includes ranking the identified repeated portions on character length and a number of repeats in the sample data.

19. The method of claim 13, wherein the analysis of the sample data included a determination of suffix trees and/or suffix arrays for the sample data.

20. The method of claim 13, wherein the output compressed version is sent to a remote system for archival or analysis.

* * * * *